(12) United States Patent
Kunimoto et al.

(10) Patent No.: US 9,644,738 B2
(45) Date of Patent: May 9, 2017

(54) COMBINATION OF CYLINDER AND PISTON RING

(71) Applicant: KABUSHIKI KAISHA RIKEN, Tokyo (JP)

(72) Inventors: Akira Kunimoto, Kumagaya (JP); Masaki Moronuki, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 159 days.

(21) Appl. No.: 14/650,154

(22) PCT Filed: Dec. 20, 2013

(86) PCT No.: PCT/JP2013/084279
§ 371 (c)(1),
(2) Date: Jun. 5, 2015

(87) PCT Pub. No.: WO2014/103940
PCT Pub. Date: Jul. 3, 2014

(65) Prior Publication Data
US 2015/0300493 A1    Oct. 22, 2015

(30) Foreign Application Priority Data

Dec. 28, 2012   (JP) .................................. 2012-286718

(51) Int. Cl.
*F16J 9/26*        (2006.01)
*C23C 16/26*    (2006.01)
(Continued)

(52) U.S. Cl.
CPC ............. *F16J 9/26* (2013.01); *C23C 16/0272* (2013.01); *C23C 16/26* (2013.01); *C23C 28/021* (2013.01);
(Continued)

(58) Field of Classification Search
CPC ... C23C 16/0272; C23C 16/26; C23C 28/021; C23C 28/027; C23C 14/0605;
(Continued)

(56) References Cited

U.S. PATENT DOCUMENTS 6,228,471 B1   5/2001  Neerinck et al.
8,033,550 B2   10/2011 Jacquet et al.
(Continued)

FOREIGN PATENT DOCUMENTS

CN      101208461 A    6/2008
CN      101629529 A    1/2010
(Continued)

OTHER PUBLICATIONS

International Search Report, issued in PCT/JP2013/084279, dated Feb. 10, 2014.
(Continued)

*Primary Examiner* — Hung Q Nguyen
*Assistant Examiner* — Tea Holbrook
(74) *Attorney, Agent, or Firm* — Birch, Stewart, Kolasch & Birch, LLP

(57) ABSTRACT

To provide a combination of a cylinder made of a hypereutectic Al—Si alloy and a hard-carbon-coated piston ring both exhibiting excellent wear resistance, the piston ring is provided with a laminate coating at least on an outer peripheral sliding surface thereof; the laminate coating comprising a metal layer, a metal-containing, hard carbon layer, and a metal-free, hard carbon layer in this order from the substrate side; the laminate coating having Martens' hardness (indentation hardness) HMs of 5-13 GPa, indentation modulus E of 70-200 GPa, and a deformation ratio Rpe of 0.45 or less, which is expressed by a ratio (Wp/We) of plastic deformation energy Wp to elastic deformation energy We; and a ratio (Tmf/Tm) of the thickness Tmf of the metal-free, (Continued)

hard carbon layer to the thickness Tm of the metal-containing, hard carbon layer being 2-8.

6 Claims, 2 Drawing Sheets

(51) Int. Cl.
*F02F 1/18* (2006.01)
*C23C 16/02* (2006.01)
*C23C 28/02* (2006.01)
*F02F 1/00* (2006.01)
*F02F 5/00* (2006.01)

(52) U.S. Cl.
CPC .............. *C23C 28/027* (2013.01); *F02F 1/00* (2013.01); *F02F 1/18* (2013.01); *F02F 5/00* (2013.01); *F05C 2203/0882* (2013.01); *F05C 2251/10* (2013.01)

(58) Field of Classification Search
CPC ... C23C 28/343; C23C 28/322; C23C 28/347; C23C 14/024; C23C 14/025; C23C 14/0635; C23C 28/42; F02F 1/00; F02F 1/18; F02F 5/00; F05C 2203/0882; F05C 2251/10; F16J 9/26; F16J 9/28; F16J 10/04; F16J 1/01; C22C 38/42; B22F 5/02
See application file for complete search history.

(56) References Cited

U.S. PATENT DOCUMENTS

| | | | |
|---|---|---|---|
| 9,103,442 B2 | 8/2015 | Kennedy et al. | |
| 2005/0005892 A1* | 1/2005 | Nishimura | C10M 145/08 123/193.4 |
| 2008/0203674 A1 | 8/2008 | Jacquet et al. | |
| 2011/0101620 A1* | 5/2011 | Hoppe | C23C 16/0272 277/442 |
| 2011/0142384 A1* | 6/2011 | Hofmann | C23C 30/005 384/42 |
| 2012/0205875 A1 | 8/2012 | Kennedy et al. | |
| 2013/0042845 A1 | 2/2013 | Kennedy et al. | |
| 2013/0084031 A1* | 4/2013 | Kennedy | C23C 14/0605 384/42 |
| 2013/0136861 A1* | 5/2013 | Barenreuter | C23C 16/0272 427/249.18 |
| 2013/0140776 A1 | 6/2013 | Kennedy | |
| 2013/0316156 A1* | 11/2013 | Kennedy | C23C 14/0605 428/213 |
| 2013/0328274 A1* | 12/2013 | Sugiura | F16J 9/20 277/444 |
| 2015/0018254 A1* | 1/2015 | Araujo | F16J 9/26 508/105 |
| 2015/0240347 A1* | 8/2015 | Lehnert | C23C 14/06 428/140 |
| 2015/0240944 A1* | 8/2015 | Ivanov | C23C 28/042 277/443 |
| 2015/0275120 A1* | 10/2015 | Lehnert | C23C 28/322 508/129 |
| 2015/0292622 A1* | 10/2015 | Kennedy | C23C 14/0605 277/442 |

FOREIGN PATENT DOCUMENTS

| | | |
|---|---|---|
| CN | 201901696 U | 7/2011 |
| CN | 102383961 A | 3/2012 |
| CN | 102676856 A | 9/2012 |
| DE | 102010062114 A1 | 5/2012 |
| EP | 0856592 A1 | 8/1998 |
| EP | 2138695 A2 | 12/2009 |
| EP | 2138695 A3 | 12/2009 |
| JP | 2007-170467 A | 7/2007 |
| JP | 2010274386 A * | 12/2010 |
| JP | 2013-501897 A | 1/2013 |
| WO | WO 2011/051008 A1 | 5/2011 |
| WO | WO 2012/100847 A1 | 8/2012 |

OTHER PUBLICATIONS

Written Opinion of the International Searching Authority, issued in PCT/JP2013/084279, dated Feb. 10, 2014.
Extended European Search Report dated Jul. 5, 2016, for European Application No. 13868434.5.
First Office Action and search report (including an English translation) issued in the corresponding Chinese Patent Application No. 201380067823.X on Feb. 1, 2016.

* cited by examiner

COMBINATION OF CYLINDER AND PISTON RING

FIELD OF THE INVENTION

The present invention relates to a combination of a cylinder and a piston ring sliding on an inner surface of the cylinder, which is used for internal combustion engines.

BACKGROUND OF THE INVENTION

Internal combustion engines such as automobile engines are recently strongly demanded to have improved fuel efficiency. Accordingly, research and development have been widely carried out to achieve size reduction, weight reduction, friction loss decrease, etc. For example, attempts have been made to use aluminum alloys for cylinders, and to coat piston rings with low-friction-coefficient, hard carbon called diamond like carbon (DLC).

Though some aluminum alloy cylinders have portions in direct sliding contact with piston rings, which have insert-molded cast iron liners or plating, both requirements of cooling performance and cost on cylinders have demanded to use for cylinders aluminum alloys having excellent wear resistance, for example, a hypereutectic Al—Si alloy having relatively hard primary Si crystals precipitated.

From the aspect of chemical stability and a low friction coefficient to aluminum alloys, attempts have been made to provide piston rings with hard carbon coatings. However, the practical use of hard carbon coatings have been largely hindered by their two essential properties that large residual stress exists because of their forming process, and that carbon bonds are chemically stable, resulting in low adhesion to substrates.

US 2012/0205875 A1 discloses a DLC-coated piston ring, the coating comprising a bonding layer, a metal-containing DLC layer, and a metal-free DLC layer in this order from inside to relax residual stress; a thickness ratio of the metal-free DLC layer to the metal-containing DLC layer being 0.7-1.5; and the coating being as thick as 5-40 μm. Extremely high internal stress of the metal-free DLC layer is offset by the metal-containing DLC layer having a similar thickness, thereby improving adhesion. It is described that the metal-free DLC layer preferably has hardness of 1700 HV0.02 to 2900 HV0.02, exhibiting excellent friction resistance and wear resistance in an experiment using a honed gray-cast-iron-made cylinder sleeve as a mating member.

However, when boundary lubrication occurs particularly in an early stage of operation of an engine with a hypereutectic Al—Si alloy as a mating member, detached Si particles act as abrasives, likely causing the local peeling of a coating due to increased local stress, failing to withstand a long period of use.

OBJECT OF THE INVENTION

An object of the present invention is to provide a combination of a cylinder made of a hypereutectic Al—Si alloy and a piston ring comprising a hard carbon coating on an outer peripheral surface, both exhibiting excellent wear resistance.

SUMMARY OF THE INVENTION

As a result of intensive research on the coating formed on the piston ring of Patent Reference 1, the inventors have found that by reducing residual stress in the outermost metal-free DLC layer, namely, by reducing the hardness and modulus of the metal-free DLC layer to as low as those of Si particles in an hypereutectic Al—Si alloy, while suppressing increase in plastic deformability, and by increasing a thickness ratio of the metal-free DLC layer to the metal-containing DLC layer, a combination of the cylinder and the piston ring can exhibit excellent wear resistance even when the cylinder is made of a hypereutectic Al—Si alloy.

Thus, the combination of a cylinder and a piston ring according to the present invention comprises a cylinder made of an aluminum alloy containing 12-38% by mass of Si, and a piston ring comprising, at least on an outer peripheral sliding surface thereof, a laminate coating comprising a metal layer, a metal-containing, hard carbon layer, and a metal-free, hard carbon layer in this order from the substrate side;

the laminate coating having Martens' hardness (indentation hardness) HMs of 5-13 GPa, indentation modulus E of 70-200 GPa, and a deformation ratio Rpe of 0.45 or less, which is expressed by a ratio (Wp/We) of plastic deformation energy Wp to elastic deformation energy We; and a ratio (Tmf/Tm) of the thickness Tmf of the metal-free, hard carbon layer to the thickness Tm of the metal-containing, hard carbon layer being 2-8.

The metal-free, hard carbon layer preferably contains 20-35 atomic % of hydrogen, or 15-30 atomic % of hydrogen and 3-12 atomic % of nitrogen.

The metal layer is preferably made of one or more elements selected from the group consisting of Si, Ti, Cr, Mn, Zr, Nb and W, and the metal-containing, hard carbon layer is preferably a hard carbon layer containing one or more elements selected from the group consisting of Si, Ti, Cr, Mn, Zr, Nb and W. The metal layer is further preferably a Cr layer, and the metal-containing, hard carbon layer is further preferably a W-containing, hard carbon layer.

DESCRIPTION OF THE PREFERRED EMBODIMENTS

Figure 1:
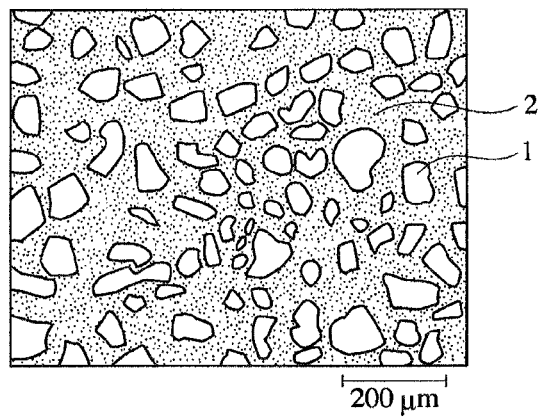
FIG. 1 is a schematic view showing the structure of a sliding surface of a cylinder according to an embodiment of the present invention.

FIG. 1 shows a sliding surface of a cylinder according to an embodiment of the present invention, in which primary Si crystal particles 1 are dispersed at a high area ratio in a eutectic matrix 2 (eutectic Si particles+aluminum matrix). The Si content is 12-38% by mass. When the Si content is less than 12%, soft primary Al crystals are undesirably precipitated, resulting in accelerated wearing. When the Si content is more than 38%, not only casting but also hot extrusion are undesirably difficult. The Si content is preferably 18-22% when produced by casting such as die-casting, and 20-30% when produced by the hot extrusion of a sintered body of rapidly solidified powder. The primary Si crystal particles preferably have diameters of 3 μm or more.

Further, $Al_2O_3$ and/or $SiO_2$ are preferably contained. Generally, an Al alloy is formed into a pipe by a hot extrusion method, subjected to predetermined machining, and then insert-molded in a cylinder block made of another Al alloy having good castability.

Figure 2:
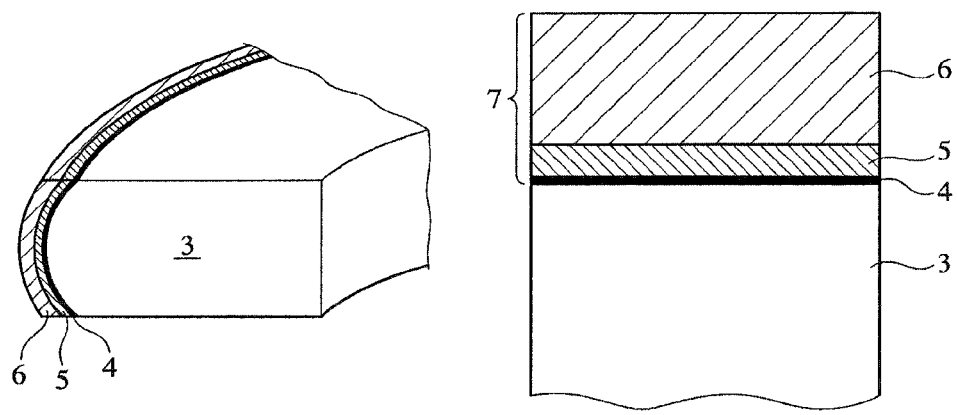
FIG. 2 is a partial cross-sectional view schematically showing a piston ring according to an embodiment of the present invention.

As shown in FIG. 2, a piston ring substrate 3 is provided with a laminate coating 7 comprising a metal layer 4, a metal-containing, hard carbon layer 5, and a metal-free, hard carbon layer 6, in this order from the substrate. From the aspect of wear resistance (life), the laminate coating 7 is preferably as thick as 2-10 µm. With the outermost metal-free, hard carbon layer 6 having hardness and modulus on the same levels as the hardness and Young's modulus (Martens' hardness HMs: 9 GPa, and Young's modulus E: about 130 GPa) of primary Si crystals predominantly withstanding a load on a sliding surface of the cylinder, the hard carbon layer 6 can avoid local peeling due to Si particles acting as abrasives.

Because the coating of the present invention is thin, the properties of the coating are determined not only by the outermost metal-free, hard carbon layer 6, but also influenced by the entire laminate coating 7 and further by the substrate 3. Accordingly, in the nanoindentation test, the coating should have Martens' hardness HMs of 5-13 GPa, indentation modulus E of 70-200 GPa, and a deformation ratio Rpe of 0.45 or less, Rpe being defined by a ratio (Wp/We) of plastic deformation energy Wp to elastic deformation energy We. When the Martens' hardness HMs is less than 5 GPa, when the indentation modulus E is less than 70 GPa, or when the deformation ratio Rpe is more than 0.45, the laminate coating 7 is highly worn by Si abrasives. When the Martens' hardness HMs is more than 13 GPa, or when the indentation modulus E is more than 200 GPa, the laminate coating 7 is locally peeled by Si abrasives, failing to be used for a long period of time. The wearing of the laminate coating 7 accelerates the wearing of the sliding surface of the Al-alloy-made cylinder by wear dust. The Martens' hardness HMs of the laminate coating 7 is preferably 6-12 GPa, more preferably 7.5-11 GPa. The indentation modulus E of the laminate coating is preferably 90-180 GPa, more preferably 100-170 GPa. The deformation ratio Rpe of the laminate coating is preferably 0.1-0.4, more preferably 0.1-0.3.

A ratio of Tmf/Tm is 2-8, wherein Tmf is the thickness of the outermost metal-free, hard carbon layer 6, and Tm is the thickness of the metal-containing, hard carbon layer 5. When Tmf/Tm is less than 2, the outermost metal-free, hard carbon layer 6 has such low internal stress and hardness that the laminate coating 7 is more worn by Si abrasives. When Tmf/Tm is more than 8, the outermost metal-free, hard carbon layer 6 does not have sufficiently decreased internal stress, so that it is undesirably subjected to local peeling by abrasion with Si particles, because of an increased friction coefficient. Tmf/Tm is preferably 2.5-6, more preferably 3-5.

The hardness and modulus of the outermost metal-free, hard carbon layer 6 generally have a close correlation to the residual compression stress of the coating, higher residual compression stress resulting in higher hardness and modulus. It is presumed that the residual compression stress is generated by the volume expansion of the hard carbon layer. For example, when hydrogen is absorbed in the hard carbon layer, carbon bonds are cut, relaxing residual stress, thereby reducing hardness and modulus. The metal-free, hard carbon layer 6 is preferably composed of only carbon and hydrogen except for inevitable impurities, with the hydrogen content of 20-35 atomic %. The metal-free, hard carbon layer 6 may also be composed of carbon, hydrogen and nitrogen. In this case, the hydrogen content is preferably 15-30 atomic %, and the nitrogen content is preferably 3-12 atomic %.

The metal-containing, hard carbon layer 5 also preferably contains hydrogen. With hydrogen contained in addition to the metal, the residual stress is further relaxed. The metal-containing, hard carbon layer 5 preferably contains one or more metal elements selected from the group consisting of Si, Ti, Cr, Mn, Zr, Nb and W, which have low free energy of forming carbides, thereby easily reacting with carbon to form carbides. The hard carbon layer containing W is particularly preferable. The metal content is preferably 5-30 atomic %, more preferably 7-25 atomic %.

The metal-containing, hard carbon layer 5 may have a compositional gradient structure comprising a metal-rich portion on the side of the metal layer 4, and a carbon-rich portion on the side of the metal-free, hard carbon layer 6.

Like the metal-containing, hard carbon layer 5, the metal layer 4 is preferably composed of one or more metal elements selected from the group consisting of Si, Ti, Cr, Mn, Zr, Nb and W, which have low free energy of forming carbides, thereby easily reacting with carbon to form carbides. A metallic Cr layer is particularly preferable.

The substrate 3 is preferably carbon steel, silicon chromium steel, martensitic stainless steel, etc., which are usually used for piston rings. Of course, the laminate coating 7 may be formed on the substrate 3 directly or via a primer layer such as a nitrided layer, a Cr-plating layer, a CrN coating layer, etc.

The outermost metal-free, hard carbon layer 6 constituting the sliding surface of the piston ring has surface roughness Rzjis [ten-point-averaged roughness, JIS B0601 (2001)] of preferably 0.15 µm or less, more preferably 0.12 µm or less. After coated, the sliding surface of the piston ring is preferably ground to Rzjis of 0.15 µm or less, if necessary.

In the combination of a cylinder and a piston ring according to the present invention, the laminate coating is formed on the piston ring by a physical vapor deposition (PVD) method such as sputtering, arc ion plating, etc., or by a plasma chemical vapor deposition (CVD) method, etc. A multi-target sputtering apparatus is particularly suitable for forming the laminate coating. For example, using a sputtering apparatus equipped with a Cr target and a W target in a vacuum chamber, the outermost metal-free, hard carbon layer can be formed by sputtering the Cr target to form a Cr layer, stopping the sputtering of the Cr target, sputtering a W target while introducing a hydrocarbon gas such as methane, acetylene, etc. and an Ar gas to form a W-containing, hard carbon layer, and stopping the sputtering of the W target. The formation of the hard carbon layer is conducted by a so-called plasma CVD method, by which the hydrocarbon gas is decomposed and precipitated on the substrate in plasma discharge generated by negative bias voltage applied to the substrate from a power supply. Of course, instead of using a hydrocarbon gas, a graphite target may be sputtered by a PVD method to form a hard carbon layer.

EXAMPLE 1

50 degreased piston rings each having a rectangular cross section and a barrel-faced outer peripheral surface and made of nitrided SUS420J2 [nominal diameter (d): 90 mm, thickness (h1): 1.2 mm, and width (a1): 3.2 mm] were stacked on a coating jig, and the coating jig was placed on a rotating table in a film-forming apparatus comprising a first target of Cr and a second target of W. Composition-analyzing samples of hardened, mirror-polished SKH51 having an outer diameter of 25 mm and a thickness of 5 mm were set on a similar jig to the jig for the outer peripheral surfaces of piston rings. After the apparatus was evacuated to a predetermined degree of vacuum, negative bias voltage was applied to the coating jig while introducing an Ar gas, to carry out a cleaning treatment by glow discharge. Thereafter, a Cr layer was formed on the outer peripheral surface of each piston ring for a predetermined period of time by the sputtering of Cr. After stopping the sputtering of Cr, an $C_2H_2$ gas was introduced together with an Ar gas simultaneously with starting the sputtering of W, to form a W-containing, hard carbon layer for a predetermined period of time. The sputtering of W was then stopped, and a W (metal)-free, hard carbon layer was formed for a predetermined period of time. During the process, negative bias voltage was applied to the coating jig. A composition-analyzing sample for the W-containing, hard carbon layer was separately produced by forming a W-containing, hard carbon layer and then stopping the process.

EXAMPLES 2-5 AND COMPARATIVE EXAMPLES 1-3

Each laminate coating of a Cr layer, a W-containing, hard carbon layer and a metal-free, hard carbon layer, which may be called Cr/DLC(W)/DLC, was formed on piston rings and composition-analyzing samples, in the same manner as in Example 1 except for changing the time period of forming each layer in the laminate coating.

The piston rings and composition-analyzing samples each having a laminate coating of Cr/DLC(W)/DLC in Examples 1-5 and Comparative Examples 1-3 were measured as described below.

[1] Measurement of Thickness

The thickness of each layer from a substrate in the laminate coating was measured by so-called Calotest by a sphere-grinding method.

[2] Microhardness Test for Measuring Martens' Hardness, Indentation Modulus and Deformation Ratio The measurement of Martens' hardness HMs, indentation modulus E and deformation ratio Rpe was conducted by a loading-unloading test using a nanoindentation tester with a Berkovich indenter (DUH-211 available from Shimadzu Corporation) according to ISO 14577-1 (instrumented indentation hardness test), under the conditions that a test force was 19.6 mN, an unloading speed was 0.4877 mN/sec, and a loading to unloading time was 5 seconds, with Cf-Ap correction. A coating surface was ground with a steel ball of 30 mm in diameter coated with a paste of diamond having an average particle size of 0.25 μm, and subjected to the measurement. The Martens' hardness HMs, indentation modulus E, and deformation ratio Rpe were calculated from a load-indentation depth curve. 10 measured values were averaged.

[3] Composition Analysis of Hard Carbon Layers

Using the composition-analyzing samples, the composition analysis of the hard carbon layers was conducted by an electron probe micro analyzer (EPMA) for metals, and by a Rutherford backscattering spectroscopy (RBS) and a hydrogen forward scattering spectrometry (HFS) for hydrogen.

[4] Measurement of Surface Roughness

Using a stylus roughness tester, the surface roughness was measured at five points with different stylus-moving directions under the conditions defined by JIS B 0638 (2001), and averaged.

[5] Adhesion Test

The adhesion of the laminate coating was evaluated by a peeling test according to the standard of VDI Technologiezentrum GmbH (VDI3198, coating of cold forging tools). In the method using a Rockwell hardness meter, HF1 to HF4 were judged as "good," and HF5 and HF6 were judged as "poor."

[6] Wearing Test

Figure 3A:
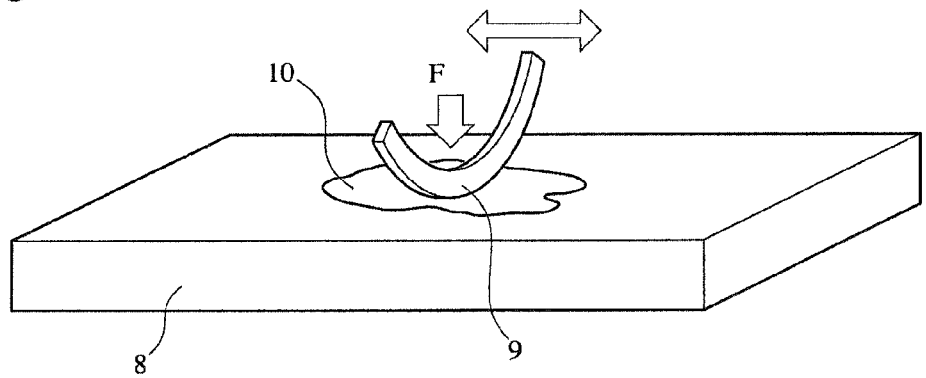
FIG. 3(a) is a view showing a reciprocal sliding test method.
Figure 3B:
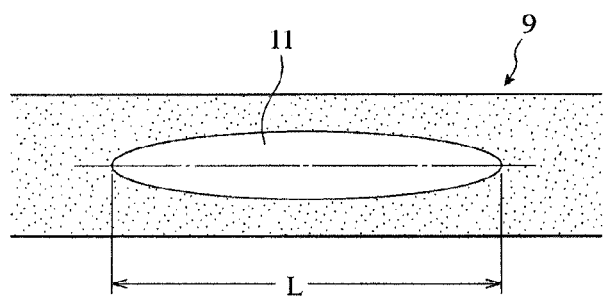
FIG. 3(b) is a view showing a sliding portion of a piston ring generated in a reciprocal sliding test.

As shown in FIG. 3(a), the wearing test was conducted by reciprocally sliding a piston ring attached to fixing jig (not shown) in a width direction (axial direction) on an aluminum alloy plate 8 corresponding to a cylinder. The plate 8 was an Al—$Si_{20}$ alloy plate (mass %) ground to surface roughness Rzjis of 1.1 μm, and the piston ring was a piston ring piece 9 cut to a length of about 30 mm. The test conditions were a vertical load F of 100 N, a reciprocal width of 50 mm, a reciprocal frequency of 10 Hz, a plate temperature of 120° C., a test time of 20 minutes, and lubrication with 1 $cm^3$ of a commercially available engine oil (5W-30SM) 10 dropped. As shown in FIG. 3(b), the wear amount of the piston ring is expressed by a longitudinal length L of an elliptical sliding portion 11 generated on the piston ring piece 9 by the test. The wear amount of the plate 8 was measured by a stylus roughness meter in a sliding direction, with non-sliding portions on both sides of the measured length. The maximum difference between the non-sliding portions and the sliding portion was defined as wear amount. The sliding surface of the plate 8 was observed by the naked eye to evaluate defects. When a scratch as long as 10 mm or more was observed, it was regarded that the sliding surface was scratched.

The measurement results of Examples 1-5 and Comparative Examples 1-3 are shown in Tables 1 and 2. The wear amounts of the laminate coating and the plate are shown by relative values with the wear amount in Comparative Example 1 as "1."

TABLE 1

| No. | Metal Layer | | Metal-Containing DLC Layer | | | Metal-Free DLC Layer | | |
|---|---|---|---|---|---|---|---|---|
| | Type | $T^{(1)}$ (μm) | Metal Type | Metal Atomic % | Hydrogen (atomic %) | $Tm^{(2)}$ (μm) | Hydrogen (atomic %) | $Tmf^{(3)}$ (μm) | Tmf/Tm |
| Example 1 | Cr | 0.61 | W | 14.2 | 25.5 | 1.12 | 28.5 | 4.55 | 4.1 |
| Example 2 | Cr | 0.40 | W | 14.0 | 24.3 | 1.98 | 27.2 | 4.13 | 2.1 |
| Example 3 | Cr | 0.45 | W | 13.8 | 22.2 | 1.58 | 26.1 | 3.99 | 2.5 |
| Example 4 | Cr | 0.56 | W | 14.1 | 23.7 | 0.85 | 24.6 | 5.07 | 6.0 |
| Example 5 | Cr | 0.52 | W | 13.9 | 24.4 | 0.65 | 25.3 | 5.10 | 7.9 |
| Comp. Ex. 1 | Cr | 0.25 | W | 14.0 | 25.6 | 4.50 | 26.4 | 5.33 | 1.2 |

TABLE 1-continued

| | Metal Layer | | Metal-Containing DLC Layer | | | | Metal-Free DLC Layer | | |
|---|---|---|---|---|---|---|---|---|---|
| No. | Type | T[1] (μm) | Type | Metal Atomic % | Hydrogen (atomic %) | Tm[2] (μm) | Hydrogen (atomic %) | Tmf[3] (μm) | Tmf/Tm |
| Comp. Ex. 2 | Cr | 0.30 | W | 13.9 | 22.5 | 5.31 | 25.5 | 4.40 | 0.8 |
| Comp. Ex. 3 | Cr | 0.40 | W | 14.1 | 25.2 | 0.9 | 27.3 | 7.74 | 8.6 |

Note:
[1]The thickness of a metal layer.
[2]The thickness of a metal-containing DLC layer.
[3]The thickness of a metal-free DLC layer.

TABLE 2

| | Laminate Coating | | | | | Wear Resistance Wear Amount (relative value) | | Defects of |
|---|---|---|---|---|---|---|---|---|
| No. | HMs (GPa) | E (GPa) | Rpe (Wp/We) | Surface Roughness Rzjis | Adhesion | Laminate Coating | Plate | Sliding Surface |
| Example 1 | 9.8 | 138 | 0.36 | 0.11 | Good | 0.17 | 0.38 | No |
| Example 2 | 6.8 | 74 | 0.43 | 0.14 | Good | 0.51 | 0.60 | No |
| Example 3 | 7.8 | 125 | 0.34 | 0.13 | Good | 0.26 | 0.47 | No |
| Example 4 | 10.9 | 144 | 0.27 | 0.09 | Good | 0.31 | 0.45 | No |
| Example 5 | 11.9 | 168 | 0.25 | 0.08 | Good | 0.63 | 0.55 | No |
| Comp. Ex. 1 | 5.8 | 65 | 0.48 | 0.16 | Good | 1 | 1 | No |
| Comp. Ex. 2 | 4.9 | 59 | 0.52 | 0.21 | Good | 1.30 | 1.20 | No |
| Comp. Ex. 3 | 14.7 | 233 | 0.15 | 0.10 | Poor | 1.10 | 0.65 | Scratched |

Figure 4:
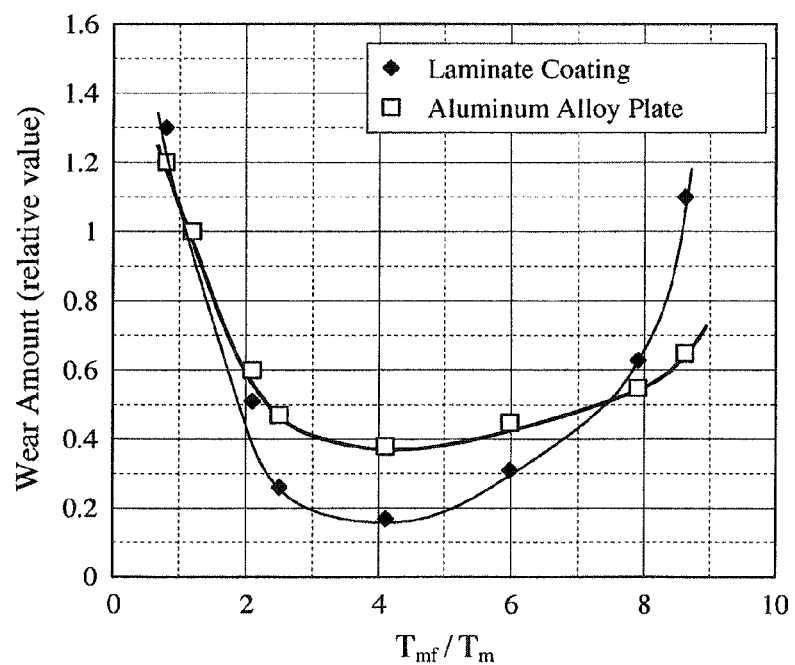
FIG. 4 is a graph showing the relation between Tmf/Tm and wear amount in a wearing test.

As is clear from FIG. 4, the wear amount of the laminate coating of the piston ring as well as the wear amount of the Al alloy plate have a close relation to Tmf/Tm, with excellent results in a Tmf/Tm range of 2-8. Decrease in adhesion was observed at Tmf/Tm of more than 8, causing the local peeling of the coating by detached Si particles, resulting in a large scratch.

EXAMPLES 6-8

Laminate coatings were formed on the piston rings and the composition-analyzing samples in the same manner as in Example 1, except that Cr/DLC(Cr)/DLC was formed in Example 6 by using metallic Cr for the first and second targets, and that Ti/DLC(Ti)/DLC and W/DLC(W)/DLC were formed in Examples 7 and 8 by using Ti and W, respectively, in place of Cr of Example 6. In Examples 7 and 8, after stopping the sputtering of Ti and W, a $N_2$ gas was introduced together with an Ar gas and an $C_2H_2$ gas. Because of an increased amount of metal ions due to the targets 2 times as large as in Example 1, the sputtering power was lowered, and the time period of forming each layer was adjusted, such that Tmf/Tm was in a predetermined range. The measurement results are shown in Tables 3 and 4. Excellent wear resistance was obtained in any Examples.

TABLE 3

| | Metal Layer | | Metal-Containing DLC Layer | | | |
|---|---|---|---|---|---|---|
| No. | Type | T[1] (μm) | Type | Metal Atomic % | Hydrogen (atomic %) | Tm[2] (μm) |
| Example 6 | Cr | 0.59 | Cr | 25.8 | 21.3 | 2.24 |
| Example 7 | Ti | 0.35 | Ti | 8.6 | 33.7 | 1.23 |
| Example 8 | W | 0.41 | W | 13.8 | 13.8 | 1.21 |

TABLE 3-continued

| | Metal-Free Layer | | | |
|---|---|---|---|---|
| No. | Hydrogen (atomic %) | Nitrogen (atomic %) | Tmf[3] (μm) | Tmf/Tm |
| Example 6 | 28.5 | — | 5.13 | 2.3 |
| Example 7 | 27.2 | 4.3 | 4.53 | 3.7 |
| Example 8 | 25.4 | 6.8 | 4.65 | 3.8 |

Note:
[1]The thickness of a metal layer.
[2]The thickness of a metal-containing DLC layer.
[3]The thickness of a metal-free DLC layer.

TABLE 4

| | Laminate Coating | | | | | Wear Resistance Wear Amount (relative value) | | Defects of |
|---|---|---|---|---|---|---|---|---|
| No. | HMs (GPa) | E (GPa) | Rpe (Wp/We) | Surface Roughness Rzjis | Adhesion | Laminate Coating | Plate | Sliding Surface |
| Example 6 | 8.2 | 103 | 0.28 | 0.12 | Good | 0.31 | 0.51 | No |
| Example 7 | 10.3 | 135 | 0.25 | 0.10 | Good | 0.23 | 0.41 | No |
| Example 8 | 11.0 | 163 | 0.21 | 0.11 | Good | 0.25 | 0.39 | No |

Note:
[1]The thickness of a metal layer.

EFFECT OF THE INVENTION

Because the combination of a cylinder and a piston ring according to the present invention comprises a laminate coating on the piston ring, whose outermost metal-free, hard carbon layer has hardness and modulus on the same level as those of Si particles in a hypereutectic Al—Si alloy, with suppressed increase in plastic deformability, the metal-free, hard carbon layer is locally worn without cracking, even if Si particles detached from the cylinder made of an hypereutectic Al—Si alloy act as abrasives on the sliding surface. As a result, the peeling of the coating due to the generation and propagation of cracks is suppressed. Also, the above structure enables the metal-containing, hard carbon layer to be thick, providing the combination of the cylinder and the piston ring with low friction loss and a long life.

What is claimed is:

1. A combination of a cylinder and a piston ring for an internal combustion engine,
    said cylinder being made of an aluminum alloy containing 12-38% by mass of Si;
    said piston ring comprising, at least on an outer peripheral sliding surface thereof, a laminate coating comprising a metal layer, a metal-containing, hard carbon layer, and a metal-free, hard carbon layer in this order from the substrate side;
    said laminate coating having Martens' hardness HMs of 5-13 GPa, indentation modulus E of 70-200 GPa, and a deformation ratio Rpe of 0.45 or less, which is expressed by a ratio (Wp/We) of plastic deformation energy Wp to elastic deformation energy We; and
    a ratio (Tmf/Tm) of the thickness Tmf of said metal-free, hard carbon layer to the thickness Tm of said metal-containing, hard carbon layer being 2-8.

2. The combination of a cylinder and a piston ring according to claim 1, wherein said metal-free, hard carbon layer contains 20-35 atomic % of hydrogen.

3. The combination of a cylinder and a piston ring according to claim 1, wherein said metal-free, hard carbon layer contains 15-30 atomic % of hydrogen, and 3-12 atomic % of nitrogen.

4. The combination of a cylinder and a piston ring according to claim 1, wherein said metal layer is made of one or more elements selected from the group consisting of Si, Ti, Cr, Mn, Zr, Nb and W.

5. The combination of a cylinder and a piston ring according to claim 1, wherein said metal-containing, hard carbon layer is a hard carbon layer containing one or more elements selected from the group consisting of Si, Ti, Cr, Mn, Zr, Nb and W.

6. The combination of a cylinder and a piston ring according to claim 5, wherein said metal layer is a Cr layer, and said metal-containing, hard carbon layer is a W-containing, hard carbon layer.

* * * * *